US009379228B2

(12) United States Patent
Saunders et al.

(10) Patent No.: US 9,379,228 B2
(45) Date of Patent: Jun. 28, 2016

(54) HETEROJUNCTION FIELD EFFECT TRANSISTOR (HFET) VARIABLE GAIN AMPLIFIER HAVING VARIABLE TRANSCONDUCTANCE

(71) Applicant: Raytheon Company, Waltham, MA (US)

(72) Inventors: Jeffrey Saunders, Andover, MA (US); Shahed Reza, Boxborough, MA (US); Eduardo M. Chumbes, Andover, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/548,646

(22) Filed: Nov. 20, 2014

(65) Prior Publication Data

US 2016/0149022 A1 May 26, 2016

(51) Int. Cl.

| | |
|---|---|
| ***H01L 31/0328*** | (2006.01) |
| ***H01L 29/778*** | (2006.01) |
| ***H01L 29/08*** | (2006.01) |
| ***H01L 29/423*** | (2006.01) |

(52) U.S. Cl.
CPC ........ *H01L 29/7782* (2013.01); *H01L 29/0891* (2013.01); *H01L 29/42356* (2013.01)

(58) Field of Classification Search
CPC ............ H01L 29/7782; H01L 29/0891; H01L 29/42356
See application file for complete search history.

(56) References Cited

U.S. PATENT DOCUMENTS

| | | | | |
|---|---|---|---|---|
| 4,315,272 | A | 2/1982 | Vorhaus | |
| 4,523,368 | A | 6/1985 | Feist | |
| 2006/0043415 | A1 * | 3/2006 | Okamoto | ............ H01L 29/7787 257/192 |

OTHER PUBLICATIONS

Srimpyee Sen, Urmimala Roy, Chaitanya Kshirsagar, Navakanta Bhat, Chandan Kumar Sarkar, Circuit Prospect of DGFET: Variable Gain Differential Amplifier and A Schmidt Trigger with Adjustable Hysteresis, IEEE,2007,IFIP International Conference on Very Large Scale Integration, pp. 280-283.

S. Diebold, D. Müller, D. Schwantuschke, S. Wagner, R. Quay, T. Zwick, I. Kallfass, AlGaN/GaN-based Variable Gain Amplifiers for W-band Operation, 2013, IEEE, Karlsruhe Institute of Technology, 4 pages.

* cited by examiner

*Primary Examiner* — Long Pham
(74) *Attorney, Agent, or Firm* — Daly, Crowley, Mofford & Durkee, LLP

(57) ABSTRACT

A heterojunction semiconductor field effect transistor HFET having a pair of layers of different semiconductor materials forming a quantum well within the structure to support the 2DEG. Source, drain and gate electrodes are disposed above the channel. The HFET has a predetermined transconductance. A transconductance control electrode varies an electric field within the structure under the channel to vary the shape of the quantum well and thereby the transconductance of the FET in accordance with a variable control signal fed to the transconductance control electrode.

15 Claims, 4 Drawing Sheets

HETEROJUNCTION FIELD EFFECT TRANSISTOR (HFET) VARIABLE GAIN AMPLIFIER HAVING VARIABLE TRANSCONDUCTANCE

TECHNICAL FIELD

This disclosure relates to heterojunction field effect transistor (HFET) based variable gain amplifiers having variable transconductance.

BACKGROUND

As is known in the art, microwave systems, including microwave radar systems, can benefit from an amplifier whose gain can be adjusted in a predictable manner. For example, Group III-V (such as Gallium Nitride (GaN)) HFET amplifiers used in radars may have oscillation problems under certain conditions (e.g. temperature) due to excessive gain at a given condition (e.g. temperature).

As is known in the art, HFETs generally are formed by providing semiconductor layers of different materials forming a heterojunction. One such layer may be, for example, GaN and the other AlGaN to provide a high-electron mobility transistor (HEMT). The heterojunction supports a two-dimensional electron gas (2DEG) confined in a triangular quantum well (a potential well with only discrete energy values) at the heterojunction. This confinement of the 2DEG leads to quantized energy levels for motion along the channel of the HFET. Electrons confined to the heterojunction of HEMTs exhibit higher mobilities than those in MOSFETs, since the former utilizes an intentionally undoped channel thereby mitigating the deleterious effect of ionized impurity scattering.

As is also known in the art, the gain of a GaN HFET amplifier is set by the HFET transconductance ($g_m$, the change in drain current divided by change in gate voltage) having a value fixed by the geometry and construction of the device and set by a fixed gate bias voltage applied at the gate above the channel of the transistor. One attempt to provide a variable gain of an FET amplifier uses two separate transistors in a cascode arrangement, such as described in a paper entitled "AlGaN/GaN-based Variable Gain Amplifiers for W-band Operation" by Diebold et al., Microwave Symposium Digest (IMS), 2013 IEEE MTT-S International DOI: 10.1109/MWSYM.2013.6697340 publication year 2013 pages 1-4. However, the use of two separate transistors is relatively costly, lower yielding, and occupies a relatively large surface area.

SUMMARY

In accordance with the present disclosure, an HFET having a heterojunction semiconductor structure is provided. The heterojunction semiconductor structure includes: a pair of layers of different semiconductor materials forming a quantum well within the channel of the structure to support the 2DEG; source, drain and gate electrodes above the channel with the HFET having a predetermined transconductance; and a transconductance control electrode for varying an electric field within the structure under the channel to vary the shape of the quantum well and thereby the transconductance of the HFET in accordance with a variable control signal fed to the transconductance control electrode.

In one embodiment, an HFET is provided having: a source electrode in ohmic contact with a first portion of a surface of a heterojunction semiconductor structure having a pair of layers of different semiconductor materials forming a quantum well within the channel of the structure to support the 2DEG; a drain electrode in ohmic contact with a second portion of the surface of the structure; and a gate electrode in Schottky contact with a third portion of the surface of the structure disposed between the first portion and the second portion for controlling a flow of carriers between the source contact and the drain contact as such carriers pass through the channel. The source electrode, drain electrode and gate electrodes are disposed above the channel on a first one of the pair of layers. A fourth electrode is provided for varying an electric field within the structure to vary the shape of the quantum well in accordance with a variable control signal fed to the fourth electrode.

In one embodiment, an HFET is provided having: a source electrode in ohmic contact with a first portion of a surface of a heterojunction semiconductor structure having a pair of layers of different semiconductor materials forming a quantum well within the channel of the structure to support the 2DEG; a drain electrode in ohmic contact with a second portion of the surface of the structure; and a gate electrode in Schottky contact with a third portion of the surface of the structure disposed between the first portion and the second portion for controlling a flow of carriers between the source contact and the drain contact as such carriers pass through the channel. The source, drain and gate electrodes are disposed above the channel on a first one of the pair of layers. The HFET has a predetermined transconductance. A transconductance control electrode is provided for varying an electric field within the structure to vary the shape of the quantum well and thereby the transconductance of the FET in accordance with a variable control signal fed to the transconductance control electrode.

In one embodiment, the transconductance control electrode is disposed in the second one of the pair of layers for varying the electric field within the structure.

In one embodiment, the transconductance control electrode is disposed in a region of the second one of the pair of layers structure under the channel for varying the electric field within a region.

In one embodiment, an insulating layer is disposed between the transconductance control electrode and the region of the second one of the pair of layers structure under the channel.

In one embodiment, the transconductance control electrode is in ohmic contact with the region of the second one of the pair of layers structure under the channel.

In one embodiment, the transconductance control electrode is in Schottky contact with the region of the second one of the pair of layers structure under the channel.

In one embodiment, an HFET structure is provided, comprising: a heterojunction semiconductor structure having a pair of layers of different semiconductor materials forming a quantum well within the channel of the structure to support the 2DEG, such structure having a predetermined nominal transconductance; a source electrode in ohmic contact with a first portion of a surface of a semiconductor; a drain electrode in ohmic contact with a second portion of the surface of the semiconductor structure; a gate electrode in Schottky contact with a third portion of the surface of the structure, the third portion being disposed between the first portion and the second portion for controlling a flow of carriers between the source contact and the drain contact as such carriers pass through the channel. The source, drain and gate electrodes are disposed above the channel. A transconductance control electrode is for varying an electric field within the semiconductor under the channel to varying the shape of the quantum well and thereby the transconductance of the transistor in accordance with a variable control signal fed to the transconductance control electrode.

In one embodiment, a system is provided, comprising: an HFET, comprising: a heterojunction semiconductor structure having a pair of different semiconductor layers forming a quantum well within the channel of the structure to support the 2DEG, such structure having a predetermined nominal transconductance; a source electrode in ohmic contact with a first portion of a surface of a semiconductor; a drain electrode in ohmic contact with a second portion of the surface of the semiconductor structure; and a gate electrode in Schottky contact with a third portion of the surface of the structure, the third portion being disposed between the first portion and the second portion for controlling a flow of carriers between the source contact and the drain contact as such carriers pass through the channel. The source, drain and gate electrodes are disposed above the channel. A transconductance control electrode is provided for varying an electric field within the semiconductor under the channel to varying the shape of the quantum well and thereby the transconductance of the transistor in accordance with a variable control signal fed to the transconductance control electrode. The system includes a variable control signal generator for producing the variable control signal.

In one embodiment, the HFET structure and the variable control signal generator are disposed on a common semiconductor.

In one embodiment, the variable control signal generator senses temperature of the semiconductor and the control signal varies in accordance with variations in the sensed temperature.

With such arrangement, varying the shape of the quantum well and thereby the transconductance ($g_m$) of an HFET is provided by adding a fourth electrode (the transconductance control electrode in addition to the source, gate, drain) to provide an electric field under the channel to confine and modulate the 2DEG, thereby varying drain current flow and hence varying the transconductance of the device.

Thus, the transconductance $g_m$ of the HFET is varied by adding a 4th electrode (in addition to the source, gate, drain) to provide an electric field under the 2DEG channel to confine and restrict the 2DEG channel, thereby restricting drain current flow and hence varying the transconductance of the device (since transconductance is defined as change in drain current divided by the change in gate voltage).

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
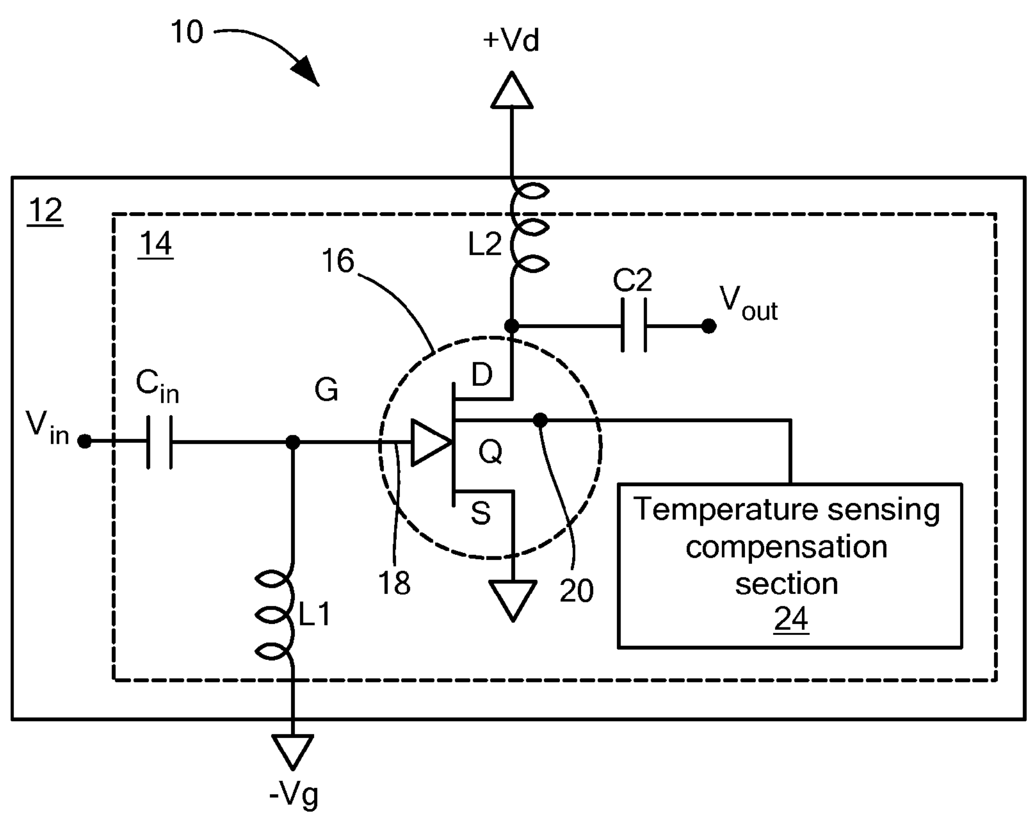
FIG. 1 is a schematic diagram of circuit having an HFET structure with a 2DEG in the channel having a predetermined nominal transconductance and a transconductance control electrode for varying an electric field under the channel to vary the shape of the quantum well and thereby the transconductance of the FET in accordance with a variable control signal fed to the transconductance control electrode in accordance with the disclosure.

Referring now to FIG. 1, a system 10 is shown formed on a single crystal substrate 12, here for example, silicon carbide (SiC). The system 10 includes a HFET amplifier 14 having an HFET 16. The HFET 16 has a gate 18 (G) fed to an RF input signal ($V_{in}$) through a coupling capacitor $C_{in}$ and to a $V_g$ bias voltage ($-V_g$) through an RF blocking inductor L1, as shown. The source electrode S of the HFET 16 is connected to ground, as shown. The drain D is connected to a ($+V_d$) bias through an RF blocking inductor, L2, as shown and provides the amplified output ($V_{out}$), after passing through a dc blocking capacitor C2, as shown.

The HFET 16 is provided with a transconductance control electrode 20 for varying the shape of the quantum well and thereby the transconductance of the HFET 16 in a manner to be described in more detail below. Suffice it to say here that the transconductance control electrode 20 is a control signal from a variable control signal generator, here, for example, a temperature sensing section 24, formed on the substrate 12, to be described. The temperature sensing section 24 generates the control signal in accordance with variations in the sensed temperature of the substrate 12.

Figure 1B:
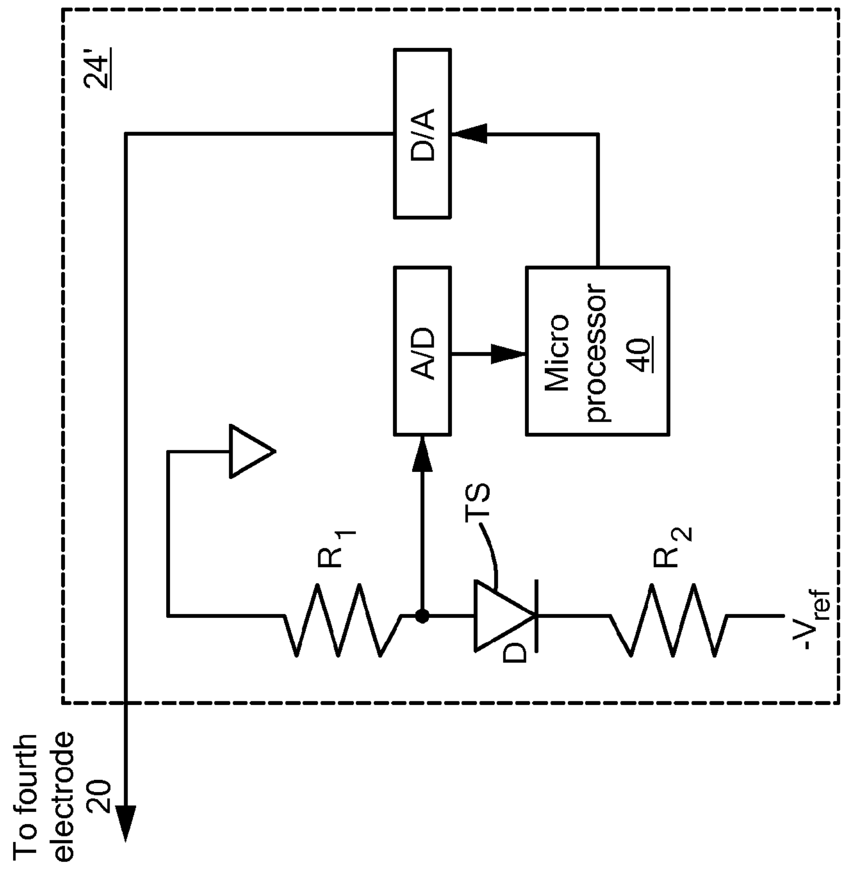
FIG. 1B, is a digital circuit used as a temperature sensing compensation section of the circuit of FIG. 1.

Here, for example, absent the temperature sensing section 24, the HFET 16 has an unwanted oscillation when the substrate 12 is at room temperature; however, the oscillation reduces as the temperature of the substrate 12 increases because the gain of the HFET 16 reduces with increasing temperature as correspondingly the unwanted oscillation reduces. Here, the temperature sensing section 24 includes a temperature sensing device TS, here, for example, a diode D-(or mesa resistor or thermistor), as a part of either analog circuitry (FIG. 1A) or digital circuitry (FIG. 1B), to reduce the transconductance, and hence the gain, of the HFET 16 at room temperature to reduce or remove the unwanted oscillation and as the temperature of the substrate 12 increases above room temperature, the temperature sensing section 24 increases the transconductance, and hence the gain, of the HFET 16 in such a way so as not to reintroduce the unwanted oscillation.

Figure 1A:
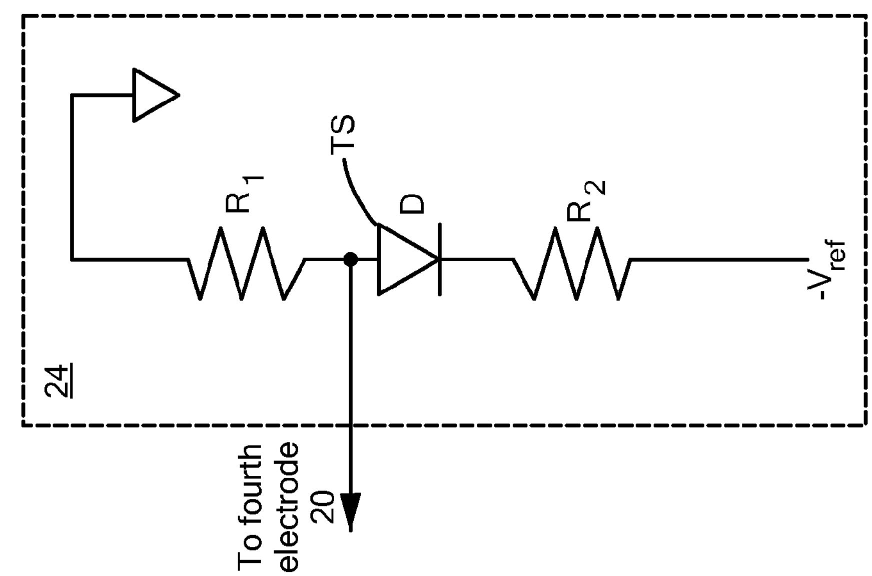
FIG. 1A, is an analog circuit used as a temperature sensing compensation section of the circuit of FIG. 1.

Thus, in FIG. 1A, here the temperature sensing device TS, is here, for example, a diode D or mesa resistor or thermistor, formed on the substrate 12, serially connected between a predetermined negative voltage source −VREF and ground through a pair of resisters R1 and R2, as shown. The output of the temperature sensing device TS is fed to the fourth electrode 20, as shown. Thus, a voltage divider network is formed having in addition to the serially connected resistors R1 and R2 the temperature sensing device TS. The voltage at the junction between temperature sensing device TS and the resistor R1 is fed to the fourth electrode 20. When the substrate 12 is at room temperature the values of R1, R2 and −VREF of the temperature sensing section 24 are selected to produce a voltage at the fourth electrode 20 that results in removal or reduction of the unwanted oscillation and, as the temperature of the substrate 12 increases above room temperature, the temperature sensing section 24 adjust the voltage at the fourth electrode 20 so that it becomes more positive to thereby increase the transconductance of the HFET 24 without reintroducing the unwanted oscillation.

For example, a measurement is made of the voltage drop $V_x$ across of the temperature sensor TS, for example diode D (or mesa resistor or thermistor), at room temperature with a predetermined current passing through it, for example, 3 mA. Assume $V_x$=2 Volt is measured with 3 mA current passing through it at room temperature. Next, the value of R1 is set to a convenient value, for example, R1=500 ohms. Next, the $-V_{REF}$ is set to a convenient negative voltage, for example, −5 Volts. With the voltage at the fourth electrode 20 at 0 Volts, the voltage at the gate electrode G, $V_G$, is selected for the desired drain current Id and/or the desired peak transconductance $g_m$; for example $V_G$=−2V. The value of the resistance of R2 is adjusted to yield a voltage applied to the fourth electrode 20 such that the oscillation at room temperature stops. For example, R2=500 ohms, and the voltage of the fourth electrode 20 is =−1.5 V In FIG. 1B the temperature sensing section 24' has the temperature sensing device TS, again, for example, the diode D (or mesa resistor or thermistor) and voltage at the junction between the anode of the temperature sensing device TS and the resistor R1 is first converted into a corresponding digital signal by an analog to digital converter (A/D). The corresponding digital signal is fed to a microprocessor 40, as shown. As a result of an a priori calibration process which produces a relationship between the voltage produced at the output of the diode D (or thermistor or mesa diode) (and hence a measure of substrate 12 temperature) and proper voltage at the fourth electrode 20 (and hence the transconductance of the HFET 24) to reduce or remove unwanted oscillations at room temperature while not reintroducing the unwanted oscillation above room temperature, the produced relationship is stored as data in a table of the microprocessor 40. The microprocessor is programmed to use the stored data to produce a proper voltage for the fourth electrode 20 at room temperature and above room temperature in accordance with the voltage produced by the diode D (or thermistor or mesa diode).

Figure 2:
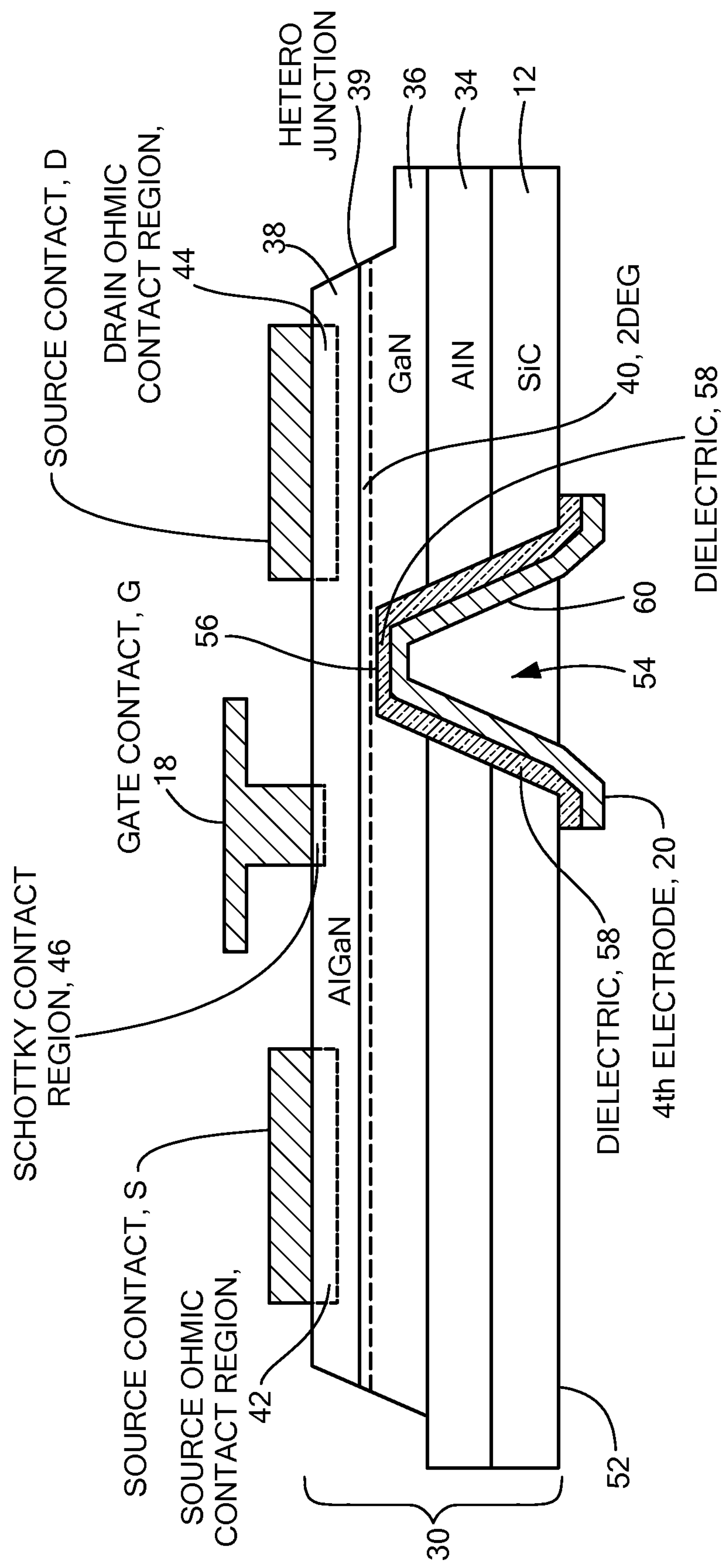
FIG. 2 is a cross section of an HFET structure having a fourth electrode implemented as an metal-insulator-semiconductor contact used in FIG. 1 in accordance with the disclosure.

Referring now to FIG. 2, the HFET 16 is shown to include: a heterojunction semiconductor structure 30 having the single crystal substrate 12, here for example, silicon carbide (SiC), a III-V buffer or nucleation layer 34, here for example, Aluminum Nitride (AlN) on the substrate 12, a gallium nitride (GaN) layer 36 on the nucleation layer 34; and an Aluminum Gallium Nitride (AlGaN) layer 38 formed on the gallium nitride (GaN) layer 36 in any conventional manner to form a heterojunction between the gallium nitride (GaN) layer 36 and the Aluminum Gallium Nitride (AlGaN) layer 38 to thereby produce a quantum well to support the 2DEG 40 within the structure 30. Once fabricated, the HFET has a predetermined nominal transconductance.

The HFET 16 has: a source electrode, S, in ohmic contact with a first portion of a surface of a source contact region 42 of the Aluminum Gallium Nitride (AlGaN) layer 38; a drain electrode, in ohmic contact with a drain contact region 44 of the Aluminum Gallium Nitride (AlGaN) layer 38; and a gate electrode, G, in Schottky contact with a Schottky contact region 46 of the Aluminum Gallium Nitride (AlGaN) layer 38, the gate contact, 18, being disposed between the source S and drain D for controlling the flow of carriers between the source S and the drain D as such carriers pass through the 2DEG 40. It is noted that the source electrode, S, the drain electrode D and gate electrode 18 (G) are in contact with the AlGaN layer 38 above the 2DEG 40.

The structure 30 includes a fourth electrode 20, here a transconductance control electrode. More specifically, a via 54 is formed through the back side 52 of the substrate 12 using any conventional technique, such as photolithographic etching or laser drilling. The via terminates in a bottom portion 56 disposed in the GaN layer 36, under the portion of the 2DEG 40 in a region between, and under, the Schottky region 46 and drain contact region 44 as shown. After forming the via 54, the sidewalls of the via 54, including the bottom portion 56 of the via 54 are coated with a thin dielectric layer 58, here, for example, silicon nitride (SiN) having a thickness in the range of 5 to 100 nm.

Next, a conductive layer 60, here a metal, for example gold, is deposited over the bottom surface 52 of the substrate 12 and is then selectively removed from the bottom 52 of the substrate 12 using any conventional photolithographic etching technique to form the fourth electrode 20, as shown. It is noted that the bottom of the fourth electrode 20 is separated from the GaN layer 36, as well as from the AlN layer 34 by underlying portions of the dielectric layer 58. With a variable voltage applied to the fourth electrode 20, a varying electric field will be produced within the GaN under the 2DEG 40 varying the shape of the quantum well and thereby the transconductance of the HFET 16 in accordance with a variable control signal fed to the transconductance control electrode, as for example, from the temperature sensing section 24 of FIG. 1.

Figure 3:
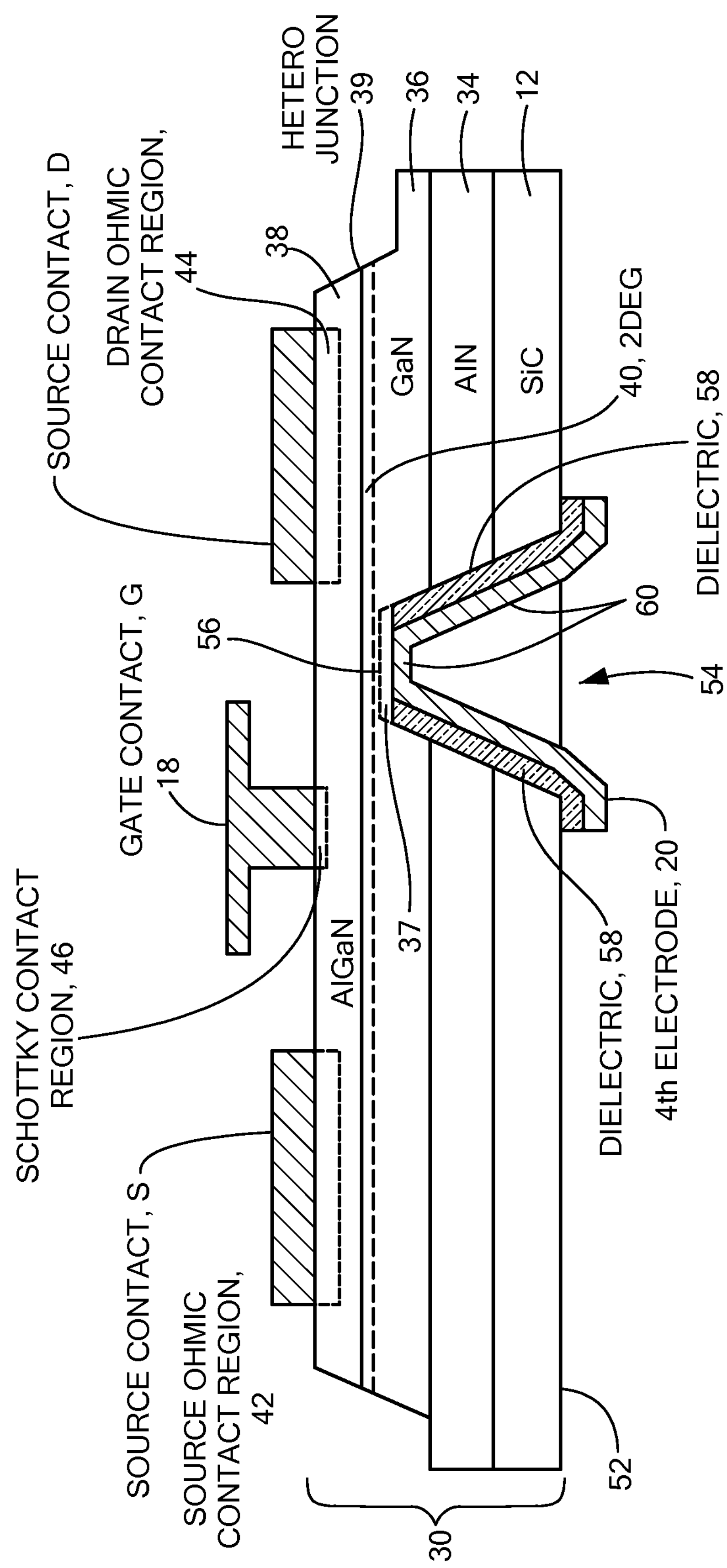
FIG. 3 is a cross section of an HFET structure having a fourth electrode implemented in ohmic or Schottky contact used in FIG. 1 in accordance with another embodiment of the disclosure.

Referring now to FIG. 3, another embodiment is shown for the HFET 16'. Here, after coating the sidewalls of the via 54, including the bottom portion 56 of the via 54 with the dielectric layer 58, here for example. SiN, the portion of the dielectric layer 58 on the bottom portion 56 is removed to expose an underlying portion of the GaN layer 36. Next, a conductive layer 60' is deposited over the bottom surface 52 of the substrate 12 and is then selectively removed from selected portions of the bottom 52 of the substrate 12 to form the fourth electrode 20', as shown. It is noted that here the fourth electrode 20' may be formed either in ohmic or Schottky contact with the portion 37 of the GaN layer 36 at the bottom portion 56 of the via 54.

A number of embodiments of the disclosure have been described. Nevertheless, it will be understood that various modifications may be made without departing from the spirit and scope of the disclosure. For example, other control circuits may be used instead of the temperature sensing compensation section, such as a section that detects output power and produces a control signal for the fourth electrode to set the gain necessary for the desired output power level. Accordingly, other embodiments are within the scope of the following claims.

What is claimed is:

1. A heterojunction semiconductor field effect transistor (FET) comprising: a structure having a pair of layers of different semiconductor materials forming a quantum well within the structure to support a two-dimensional electron gas (2DEG); source, drain and gate electrodes above the 2DEG with the FET having a predetermined transconductance; and a transconductance control electrode for varying an electric field within the structure under the 2DEG to vary the shape of the quantum well and thereby the transconductance of the FET in accordance with a variable control signal fed to the transconductance control electrode.

2. A Field Effect Transistor (FET), comprising:

a source electrode in ohmic contact with a first portion of a surface of a heterojunction semiconductor structure having a pair of layers of different semiconductor materials forming a quantum well within the structure to support a two-dimensional electron gas (2DEG);

a drain electrode in ohmic contact with a second portion of the surface of the structure;

a gate electrode in Schottky contact with a third portion of the surface of the structure disposed between the first portion and the second portion for controlling a flow of carriers between the source contact and the drain contact as such carriers pass through the 2DEG;

wherein the source electrode, drain electrode and gate electrodes are disposed above the 2DEG on a first one of the pair of layers; and a fourth electrode for varying an electric field within the structure to vary the shape of the quantum well in accordance with a variable control signal fed to the fourth electrode, the variable control signal being independent of a voltage applied to the gate electrode.

3. A Field Effect Transistor (FET) comprising:

a source electrode in ohmic contact with a first portion of a surface of a heterojunction semiconductor structure having a pair of layers of different semiconductor materials forming a quantum well within the structure to support a two-dimensional electron gas (2DEG);

a drain electrode in ohmic contact with a second portion of the surface of the structure;

a gate contact in Schottky contact with a third portion of the surface of the structure disposed between the first portion and the second portion for controlling a flow of carriers between the source contact and the drain contact as such carriers pass through the 2DEG;

wherein the source electrode, drain electrode and gate electrodes are disposed above the 2DEG on a first one of the pair of layers;

wherein the FET has a predetermined transconductance; and a transconductance control electrode is provided for varying an electric field within the structure to vary the shape of the quantum well and thereby the transconductance of the FET in accordance with a variable control signal fed to the transconductance control electrode, the variable control signal being independent of a voltage applied to the gate electrode.

4. The FET recited in claim 3 wherein the transconductance control electrode is disposed in the second one of the pair of layers for varying the electric field within the structure.

5. The FET recited in claim 3 wherein the transconductance control electrode is disposed in a region of the second one of the pair of layers in the structure under the 2DEG for varying the electric field within a region.

6. The FET recited in claim 3 including an insulating layer disposed between the transconductance control electrode and the region of the second one of the pair of layers in the structure under the 2DEG.

7. The FET recited in claim 3 wherein the transconductance control electrode is in ohmic contact with the region of the second one of the pair of layers in the structure under the 2DEG.

8. The FET recited in claim 3 wherein the transconductance control electrode is in Schottky contact with the region of the second one of the pair of layers in the structure under the 2DEG.

9. A field effect transistor, comprising:

a heterojunction semiconductor structure having a pair of layers of different semiconductor materials forming a quantum well within the heterojunction semiconductor to support a two-dimensional electron gas (2DEG);

a source electrode in ohmic contact with a first portion of a surface of a first one of the pair of layers above the 2DEG;

a drain electrode in ohmic contact with a second portion of the surface of the first one of the pair of layers;

a gate electrode in Schottky contact with a third portion of the surface of the first one of the pair of layers, the third portion being disposed between the first portion and the second portion for controlling a flow of carriers between the source contact and the drain contact as such carriers pass through the 2DEG;

wherein the field effect transistor has a predetermined transconductance; and a transconductance control electrode disposed in the second one of the pair of layers for varying an electric field within the heterojunction semiconductor structure under the 2DEG to vary the shape of the quantum well and thereby the transconductance of the transistor in accordance with a variable control signal fed to the transconductance control electrode.

10. A heterojunction field effect transistor, comprising:

a heterojunction semiconductor structure having a pair of layers of different semiconductor materials forming a quantum well within the heterojunction semiconductor structure to support a two-dimensional electron gas (2DEG), such structure having a predetermined nominal transconductance;

a source electrode in ohmic contact with a first portion of a surface of a semiconductor;

a drain electrode in ohmic contact with a second portion of the surface of the semiconductor structure;

a gate electrode in Schottky contact with a third portion of the surface of the structure, the third portion being disposed between the first portion and the second portion for controlling a flow of carriers between the source contact and the drain contact as such carriers pass through the 2DEG; and wherein the source electrode, drain electrode and gate electrode are in contact with a first one of the pair of layers, source electrode, drain electrode and gate electrode being disposed above the 2DEG;

a transconductance control electrode disposed in a second one of the pair of layers, for varying an electric field within the semiconductor under the 2DEG to vary the shape of the quantum well and thereby the transconductance of the transistor in accordance with a variable control signal fed to the transconductance control electrode.

11. A system, comprising:

(A) a heterojunction field effect transistor structure, comprising:

a heterojunction semiconductor structure having a pair of different semiconductor layers forming a quantum well within the heterojunction semiconductor structure to support a two-dimensional electron gas (2DEG), such structure having a predetermined nominal transconductance;

a source electrode in ohmic contact with a first portion of a surface of a semiconductor;

a drain electrode in ohmic contact with a second portion of the surface of the semiconductor structure;

a gate electrode in Schottky contact with a third portion of the surface of the structure, the third portion being disposed between the first portion and the second portion for controlling a flow of carriers between the source contact and the drain contact as such carriers pass through the 2DEG;

wherein the source electrode, drain electrode and gate electrode are in contact with a first one of the pair of layers, source electrode, drain electrode and gate electrode being disposed above the 2DEG;

a transconductance control electrode for varying an electric field within the semiconductor under the 2DEG to varying the shape of the quantum well and thereby the transconductance of the transistor in accordance with a variable control signal fed to the transconductance control electrode; and (B) a variable control signal generator for producing the variable control signal.

12. The system recited in claim 11 where the heterojunction field effect transistor structure and the variable control signal generator are both disposed on a common semiconductor.

13. The system recited in claim 11 wherein the variable control signal generator senses temperature of the semiconductor and the control signal varies in accordance with variations in the sensed temperature.

14. A heterojunction semiconductor field effect transistor (FET) comprising: a structure having a pair of layers of different semiconductor materials forming a quantum well within the structure to support a two-dimensional electron gas (2DEG); source, drain and gate electrodes above the 2DEG with the FET having a predetermined transconductance; and a fourth electrode for producing an electric field within the structure under the 2DEG to shape the quantum well and thereby the transconductance of the FET in accordance with a signal fed to the fourth electrode.

15. A heterojunction semiconductor field effect transistor (FET) having a predetermined transconductance, the FET comprising: a structure having a pair of layers of different semiconductor materials forming a quantum well within the structure to support a two-dimensional electron gas (2DEG) within the structure; source, drain and gate electrodes; and, a transconductance control electrode for varying an electric field within the structure to vary the shape of the quantum well and thereby the transconductance of the FET in accordance with a variable control signal fed to the transconductance control electrode, the variable control signal being independent of a voltage applied between a pair of the source, drain and gate electrodes.

* * * * *